(12) United States Patent
Lai et al.

(10) Patent No.: US 9,978,868 B2
(45) Date of Patent: May 22, 2018

(54) NEGATIVE CAPACITANCE FIELD EFFECT TRANSISTOR WITH CHARGED DIELECTRIC MATERIAL

(71) Applicants: Taiwan Semiconductor Manufacturing Company, Ltd., Hsin-Chu (TW); National Taiwan University, Taipei (TW)

(72) Inventors: Der-Chuan Lai, Taipei (TW); Samuel C Pan, Hsinchu (TW); Yu-Cheng Shen, Taipei (TW); Min-Hung Lee, New Taipei (TW); Chee-Wee Liu, Taipei (TW)

(73) Assignees: TAIWAN SEMICONDUCTOR MANUFACTURING CO., LTD., Hsin-Chu (TW); NATIONAL TAIWAN UNIVERSITY, Taipei (TW)

( * ) Notice: Subject to any disclaimer, the term of this patent is extended or adjusted under 35 U.S.C. 154(b) by 0 days. days.

(21) Appl. No.: 14/942,005

(22) Filed: Nov. 16, 2015

(65) Prior Publication Data

US 2017/0141235 A1 May 18, 2017

(51) Int. Cl.
*H01L 29/78* (2006.01)
*H01L 21/28* (2006.01)
(Continued)

(52) U.S. Cl.
CPC .. *H01L 29/78391* (2014.09); *H01L 21/28291* (2013.01); *H01L 29/16* (2013.01);
(Continued)

(58) Field of Classification Search
CPC ............... H01L 27/11502; H01L 28/55; H01L 27/11507; H01L 27/11585; H01L 29/78391; H01L 29/16; H01L 29/516; H01L 29/7856; H01L 29/401; H01L 29/513; H01L 29/6684; H01L 21/28291; G11C 11/16; G11C 11/22
(Continued)

(56) References Cited

U.S. PATENT DOCUMENTS 7,875,958 B2 * 1/2011 Cheng .................... B82Y 10/00
257/190
8,487,378 B2 7/2013 Goto et al.
(Continued)

OTHER PUBLICATIONS

Khan et al., "Ferroelectric Negative Capacitance MOSFET: Capacitance Tuning & Antiferroelectric Operation," Dec. 2011, Electron Devices Meeting (IEDM). 2011 IEEE International, pp. 11.3.1-11.3.4.
(Continued)

*Primary Examiner* — Walter H Swanson
(74) *Attorney, Agent, or Firm* — Haynes and Boone, LLP

(57) ABSTRACT

The present disclosure provides a semiconductor device in accordance with some embodiments. The semiconductor device includes a substrate; a gate stack over the substrate. The gate stack includes a ferroelectric layer; a first dielectric material layer; and a first conductive layer. One of the first dielectric material layer and the ferroelectric layer is electrically charged to form a charged layer with fixed charge. The semiconductor device further includes source and drain features formed on the substrate and disposed on sides of the gate stack.

20 Claims, 17 Drawing Sheets

(51) Int. Cl.

| | |
|---|---|
| *H01L 29/16* | (2006.01) |
| *H01L 29/40* | (2006.01) |
| *H01L 29/51* | (2006.01) |
| *H01L 29/66* | (2006.01) |

(52) U.S. Cl.
CPC .......... *H01L 29/401* (2013.01); *H01L 29/513* (2013.01); *H01L 29/516* (2013.01); *H01L 29/6684* (2013.01); *H01L 29/7856* (2013.01)

(58) Field of Classification Search
USPC .............................................. 257/295; 438/3
See application file for complete search history.

(56) References Cited

U.S. PATENT DOCUMENTS

| | | | |
|---|---|---|---|
| 8,729,634 | B2 | 5/2014 | Shen et al. |
| 8,826,213 | B1 | 9/2014 | Ho et al. |
| 8,887,106 | B2 | 11/2014 | Ho et al. |
| 9,263,542 | B2 | 2/2016 | Liu et al. |
| 2007/0126045 | A1* | 6/2007 | Choi .......... H01G 7/06 257/310 |
| 2012/0098054 | A1* | 4/2012 | Currie ........ H01L 21/2807 257/329 |
| 2012/0139017 | A1* | 6/2012 | Yamazaki ........ G06K 19/04 257/288 |
| 2012/0292677 | A1* | 11/2012 | Dubourdieu ...... H01L 29/42316 257/295 |
| 2014/0054711 | A1* | 2/2014 | Chuang .......... H01L 29/42356 257/368 |
| 2014/0282326 | A1 | 9/2014 | Chen et al. |

OTHER PUBLICATIONS

Fowkes, Frederick M. and Hess, Dennis W., Control of fixed charge at Si—Si02 interface by oxidation-reduction Treatments, Applied Physics Letters, 22, 377-379 , Apr. 15, 1973.
Muller, Johannes et al., "Ferroelectricity in Simple Binary ZrO2 and HfO2", NANO Letters, ACS Publications, Published Jul. 19, 2014, pp. 12 pages.
Li, J., et al. "Ultrafast polarization switching in thin-film ferroelectrics." Applied physics letters 84.7 Feb. 16, 2004.
Rusu, A.; Salvatore, G.A.; Jimenez, D.; Ionescu, A.M., "Metal-Ferroelectric-Metal-Oxide-semiconductor field effect transistor with sub-60mV/decade subthreshold swing and internal voltage amplification," Electron Devices Meeting (IEDM), 2010.
Then, H. W., et al. "Experimental Observation and Physics of "Negative" Capacitance and Steeper than 40mV/decade Subthreshold Swing in Al0. 83In0. 17N/AlN/GaN MOS-HEMT on SiC Substrate." Int. Electron Devices Meeting (IEDM) Tech. Dig. 2013.
Ueda, Akitsugu, et al. "Ultra-low voltage (0.1 V) operation of Vth self-adjusting MOSFET and SRAM cell." VLSI Technology (VLSI-Technology): Digest of Technical Papers, 2014 Symposium on. IEEE, 2014.
Haun, M. J., et al. "Thermodynamic theory of the lead zirconate-titanate solid solution system, part III: Curie constant and sixth-order polarization interaction dielectric stiffness coefficients." Ferroelectrics 99.1 (1989).
Feynman, Richard et al., "The Feynman Lectures on Physics", vol. II, Chap. 11: Inside Dielectrics, Section 11-7 Ferroelectricity; BaTiO3, http://www.feynmanlectures.caltech.edu/II_11.html, Copyright 1963, 2006, 2010 by California Institute of Technology, 10 pages.

* cited by examiner

US 9,978,868 B2

NEGATIVE CAPACITANCE FIELD EFFECT TRANSISTOR WITH CHARGED DIELECTRIC MATERIAL

BACKGROUND

In semiconductor technology, an integrated circuit pattern can be defined on a substrate using a photolithography process. Dual damascene processes are utilized to form multilayer copper interconnections including vertical interconnection vias/contacts and horizontal interconnection metal lines. During a dual damascene process, a plug filling material is employed to fill in the vias (or contacts) and the material is then polished back. However, the vias (or contacts) are defined by a different lithography process and may cause misalignments between the underlying metal lines and the vias. Especially, when the semiconductor technologies move forward to advanced technology nodes with smaller feature sizes, such as 20 nm, 16 nm or less, the misalignments have less tolerance and may cause short, opening or other issues.

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor. Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate. In some structures, other materials are proposed to be used in the gate stack. However, these materials provide advantages of the device performance on one side and introduce new problems, such as hysteresis issue, on another side.

Therefore, the present disclosure provides a semiconductor structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
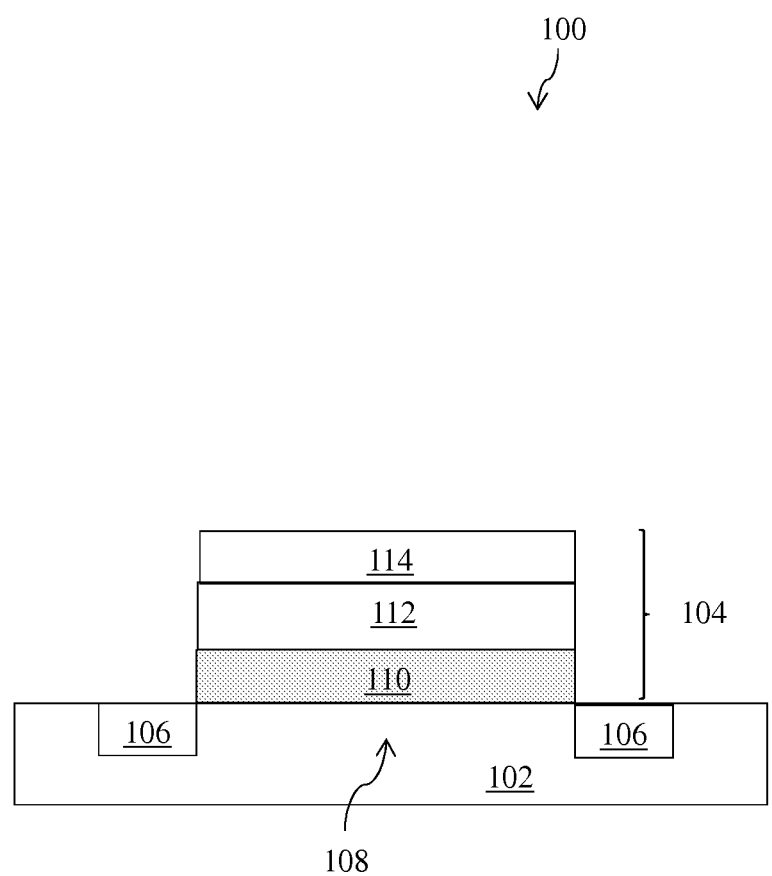
FIG. 1 illustrates a sectional view of a semiconductor structure in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A field effect transistor (FET) and the method of forming the same are provided in accordance with various exemplary embodiments. The intermediate stages of forming the FET are illustrated. The variations of the embodiments are discussed. Throughout the various views and illustrative embodiments, like reference numbers are used to designate like elements.

Embodiments such as those described herein provide a negative capacitance FET (NCFET) with negative capacitance gate stack having a dielectric material layer, a conductive layer and a ferroelectric layer stacked together. Particularly, one of the dielectric material layer and the ferroelectric layer is charged during the fabrication, thereby forming a charged layer (or charge layer). The charged layer has a charge density at a certain level such that the device is hysteresis-free. In various embodiments, the semiconductor device has a single gate stack, double gate stacks, or multiple gate stacks, such as fin-like FET (FinFET). In other embodiments, the ferroelectric layer may be alternatively replaced by an anti-ferroelectric layer.

The use of the charged layer and ferroelectric layer allows formation of FET devices having lower subthreshold swing (SS) while eliminating the hysteresis behavior. SS represents the easiness of switching the transistor current off and on, and is a factor in determining the switching speed of a FET device. SS allows for FET devices having higher switching speed compared to conventional FET devices. To improve the subthreshold swing, the thicker the ferroelectric material layer, the better. However, the thicker ferroelectric layer introduces undesired hysteresis $I_d$-$V_g$ behavior. Therefore, the disclosed FET structure has a better SS and is hysteresis-free.

FIG. 1 illustrates a schematic cross-sectional view of a semiconductor structure 100 in accordance with some embodiments. In the illustrated embodiment, the semiconductor structure 100 includes a substrate 102, a gate stack 104 on the substrate, source and drain features 106 disposed on two sides of the gate stack 104, and a channel region 108 disposed between the source and drain features 106.

In some embodiments, the substrate 102 includes silicon. Alternatively, the substrate 102 may include other elementary semiconductor such as germanium in accordance with some embodiments. In some embodiments, the substrate 102 additionally or alternatively includes a compound semiconductor such as silicon carbide, gallium arsenic, indium arsenide, and indium phosphide. In some embodiments, the substrate 102 includes an alloy semiconductor such as silicon germanium, silicon germanium carbide, gallium arsenic phosphide, and gallium indium phosphide. The substrate 102 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like. In various embodiments, the substrate 102 includes various p-type doped regions and/or n-type doped regions, such as p-type wells, n-type wells, p-type source/drain features and/or n-type source/drain features, formed by a process such as ion implantation and/or diffusion. The substrate 102 may include other functional features such as a resistor, a capacitor, diode, transistors, such as field effect transistors (FETs). The substrate 102 may include lateral isolation features configured to separate various devices formed on the substrate 102.

The gate stack 104 is formed on the substrate 102 by a procedure that includes depositions and patterning. The gate stack 104 includes a first dielectric material layer 110; a ferroelectric layer 112; and a conductive material layer 114. At least one of the first dielectric material layer 110 and the FE layer 112 is electrically charged to form a charged layer with fixed charge.

In some embodiments, the first dielectric material layer 110 is disposed on the substrate 102 and functions as gate dielectric. The first dielectric material layer 110 may include one or more dielectric films with proper thickness designed and configured for better device performance. In some examples, the first dielectric layer 110 includes a high-k dielectric material layer formed on the substrate 102. The high-k dielectric layer is a dielectric material having the dielectric constant higher than that of thermal silicon oxide, about 3.9. The high-k dielectric layer is formed by a suitable process such as atomic layer deposition (ALD). Other methods to form the high-k dielectric material layer include metal-organic chemical vapour deposition (MOCVD), physical vapor deposition (PVD), UV-Ozone Oxidation or molecular beam epitaxy (MBE). In one embodiment, the high-k dielectric material includes HfO2. Alternatively, the high-k dielectric material layer includes metal nitrides, metal silicates or other metal oxides.

In some examples, the first dielectric material layer 110 may further includes an interfacial layer (IL) interposed between the substrate 102 and the high-k dielectric material layer. In the present examples, the IF layer is formed on the substrate 102 before forming the high-k dielectric material layer. The interfacial layer may include silicon oxide formed by a proper technique, such as an atomic layer deposition (ALD), thermal oxidation or UV-Ozone Oxidation. The interfacial layer may have a thickness less than 10 angstrom. In various examples, the interfacial layer may include semiconductor oxide (such as silicon oxide when the substrate 102 includes silicon or germanium oxide when the substrate 102 includes germanium).

The gate stack 104 includes the ferroelectric (FE) layer 112 disposed adjacent the first dielectric material layer 110. The ferroelectric layer 112 includes electric dipoles. In some embodiments, the ferroelectric layer 112 has a thickness between 0.1 μm and 1 μm. The exemplary materials of the ferroelectric layer 112 include HfO2, HfSiOx, HfZrOx, Al2O3, TiO2, LaOx, BaSrTiOx (BST), PbZrxTiyOz (PZT), or the like. The first ferroelectric layer 112 may be formed using sputtering, PVD, CVD, or the like. In some embodiments, an annealing process may be further applied to the ferroelectric layer 112.

It is appreciated that although some of the candidate materials (such as $HfSiO_x$, $HfZrO_x$, $Al_2O_3$, $TiO_2$, and $LaO_x$) of the ferroelectric layer 112 includes the same elements as some high-k dielectric materials, the ferroelectric layer 112 has different properties than high-k dielectric materials. For example, the ferroelectric layer 112 may have a resistivity lower than the respective high-k dielectric material that contains the same type of elements. The ferroelectric layer 112 may still be a dielectric layer, except that if it is used as a gate dielectric, the leakage current will be high. Accordingly, the ferroelectric layer 112 may not be suitable to be used as a gate dielectric even if it may also include the same elements as some known high-k dielectric materials. For example, the hafnium oxide ferroelectric layer 112 includes hafnium oxide doped with silicon or zirconium.

In addition, the atomic percentages in the ferroelectric layer 112 may be different from the respective high-k dielectric materials that include the same elements. Alternatively stated, the composition (reflecting the type of elements and the percentages of the elements) of the ferroelectric layer 112 may be different from a high-k dielectric material even if they include the same elements. For example, $HfSiO_x$, when used as a high-k material, has a relatively low atomic percentage ratio $P_{Hf}/P_{Si}$, which may be smaller than about 10, wherein $P_{Hf}$ is the atomic percentage of hafnium, and $P_{Si}$ is the atomic percentage of silicon. When used to form the first ferroelectric layer 203, however, $HfSiO_x$ is Hf rich and Si poor. For example, the atomic percentage ratio $P_{Hf}/P_{Si}$ in the respective ferroelectric $HfSiO_x$ may be increased to greater than about 10, and may be in the range between about 10 and about 100.

In addition, whether the ferroelectric layer 112 will have the ferroelectric property or not is affected by various factors including, and not limited to, the elements contained, the percentage of the elements, and the phase of the resulting crystal structure. The phase is also affected by the deposition process conditions and post-treatment conditions for forming the ferroelectric layer 112. Accordingly, even if a material has the same elements and same percentages of the elements as the first ferroelectric layer 112, this material is not necessarily a ferroelectric material. For example, the formation conditions and the subsequent annealing process can affect whether the ferroelectric property can be achieved or not.

In some embodiments, the ferroelectric layer 112 has a crystalline structure, while the first dielectric material layer 110 has an amorphous structure. In these embodiments, the ferroelectric layer 112 and the first dielectric layer 110 may have a same composition (including same type of elements and same atomic percentages of the elements) or different compositions.

One of the first dielectric material layer 110 and the ferroelectric layer 112 is electrically charged to form a charge layer with fixed charge. It is noted that the fixed charge is always present in the charge layer regardless the semiconductor structure 100 is biased or idle without biasing. The charge is transferred to the charge layer during the fabrication instead of during the applications. In some embodiments, the first dielectric material layer 110 is the charged layer. In some other embodiments, the ferroelectric layer 112 is the charged layer.

The charge layer is formed during the fabrication by a suitable technique, such as an oxygen treatment. In some embodiments, the first dielectric material layer 110 is electrically charged by exposing the first dielectric material layer 110 in an oxygen environment, such as a mixture of CO and $CO_2$. In furtherance of the embodiments, the first dielectric material layer 110 is electrically charged by exposing the first dielectric material layer 110 in an environment with a low but substantially constant oxygen partial pressure of a mixture of CO and $CO_2$, such as a partial pressure ranging between $10^{-17}$ and $10^{-19}$ atm. In some examples, the first dielectric material layer 110 is exposed to the oxygen environment at an elevated treatment temperature, such as a temperature greater than 900° C. The exposure duration may last about one hour to a few hours for examples. The charge density of the charge layer can be tuned by tuning various factors of the charging process, such as treatment temperature, partial pressure, treatment duration or a combination thereof. Other technique may be used to electrically charge the dielectric material layer 110 to form the charge layer with fixed charge. For example, an oxygen ion implantation process may be applied to the first dielectric material layer 112 to from the charge layer.

The desired charge density in the charge layer is determined according to the performance of the semiconductor structure 100, such as the hysteresis and the subthreshold swing. In the present embodiments, the charged layer has a charge density of $5 \times 10^{13}$ $cm^{-2}$ within 10% variation. The term 10% variation means that the parameter is around the nominal value with ±10% variation of the nominal value. In the present case, the charge density ranges from (1−10%) $5 \times 10^{13}$ $cm^{-2}$ to (1+10%) $5 \times 10^{13}$ $cm^{-2}$.

The gate stack 104 includes the first conductive layer 114. In some embodiments, the first conductive layer 114 includes a metallic material such as silver, aluminum, copper, tungsten, nickel, alloys thereof (such as aluminum copper alloy), or metal compound (such as titanium nitride or tantalum nitride). The first conductive layer 114 may be formed using physical vapor deposition (PVD), plating, a combination thereof, or other suitable technology. The first conductive layer 114 may include metal silicide, doped silicon or other suitable conductive material in accordance with some embodiments. The first conductive layer 114 may include other multiple conductive material films properly designed, such as specifically designed for n-type FET and p-type FET, respectively.

The semiconductor structure 100 may have various embodiments, alternatives or extensions. In some embodiments, the ferroelectric layer 112 may alternatively be replaced by an anti-ferroelectric (AFE) layer, such as lead zirconate ($PbZrO_3$ or PZ)-based antiferroelectric materials.

The formation of the semiconductor structure 100 includes forming the gate stack 104 by deposition and patterning; forming source and drains 106; and forming other features, such as interconnection structure to couple the semiconductor device 100 and other devices to an integrated circuit. Furthermore, the formation of the gate stack 104 includes depositing various gate material layers, such as the first gate dielectric material layer 110, the ferroelectric layer 112 and the first conductive layer 114; and then patterning the gate material layers to form the gate stack 104. During the deposition, one of the first dielectric material layer 110 and the ferroelectric layer is electrically charged to form a charge layer with fixed charge. For example, when the first dielectric material layer 110 is electrically charged, the first dielectric material layer 110 is charged by a charging process and the subsequent material layer (such as ferroelectric layer 112) is deposited thereafter. The patterning further includes lithography process and etching. A hard mask layer may be further used to pattern the gate stack 104.

In the semiconductor structure 100, the gate stack 104, the source and drain features 106 and the channel region 108 are configured to form a negative capacitance FET with a charge layer, therefore with reduced subthreshold swing and eliminated hysteresis. In some embodiments, the semiconductor structure 100 may include additional features, such as gate spacer/isolation features as illustrated in FIG. 2, or the gate stack 104 includes additional material layers in as illustrated in FIGS. 3 through 11, which are described below, respectively.

Figure 2:
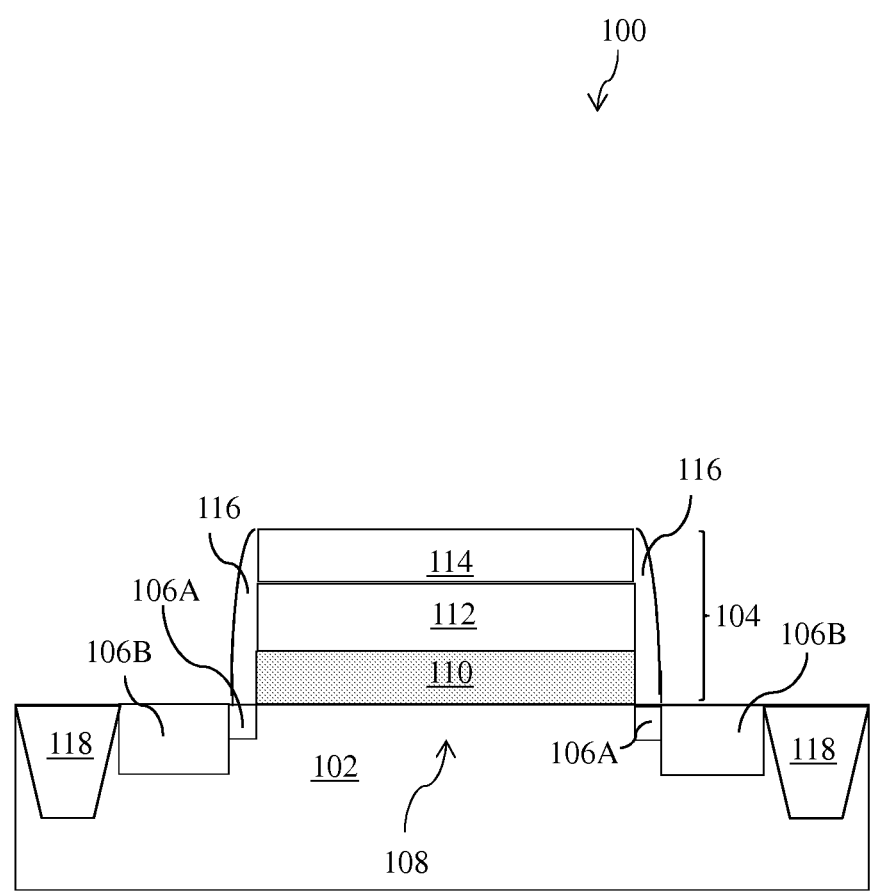
FIG. 2 illustrates a sectional view of a semiconductor structure in accordance with some embodiments.

FIG. 2 illustrates a schematic cross-sectional view of a semiconductor structure 100 in accordance with some embodiments. In some embodiments, the semiconductor device 100 may include gate spacers 116 formed on sidewalls of the gate stack 104. The gate spacers 116 includes one or more dielectric material and are formed by deposition and anisotropic etch, such as dry etch. In some embodiments, the source and drain features 106 may further include lightly doped drain (LDD) features 106A with a first doping concentration and heavily doped source and drain 106B with a second doping concentration greater than the first doping concentration. The LDD features 106A define the channel region 108 therebetween. The heavily doped source and drain features 106B reduce the source and drain contact resistance. The LDD features 106A and the heavily doped source and drain features 106B may be formed by respective ion implantations. In some embodiments, the gate spacers 116 and the source and drain features 106 are formed by a procedure that includes forming the LDD features 106A by first ion implantation; forming the gate spacers 116; and forming the heavily doped source and drain features 106B by second ion implantation.

In some embodiments, the semiconductor structure 100 includes various isolation features, such as shallow trench isolation (STI) features 118, formed in the substrate to define active regions and separate various devices from each. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

As noted above, the gate stack 104 may include additional material layer(s), such as a second dielectric material layer, a second conductive layer or both. One of the dielectric material layers and the ferroelectric layer is electrically charged to form the charge layer with the fix charge. Various configurations of the semiconductor structure 100 are constructed according to different embodiments.

Figure 3:
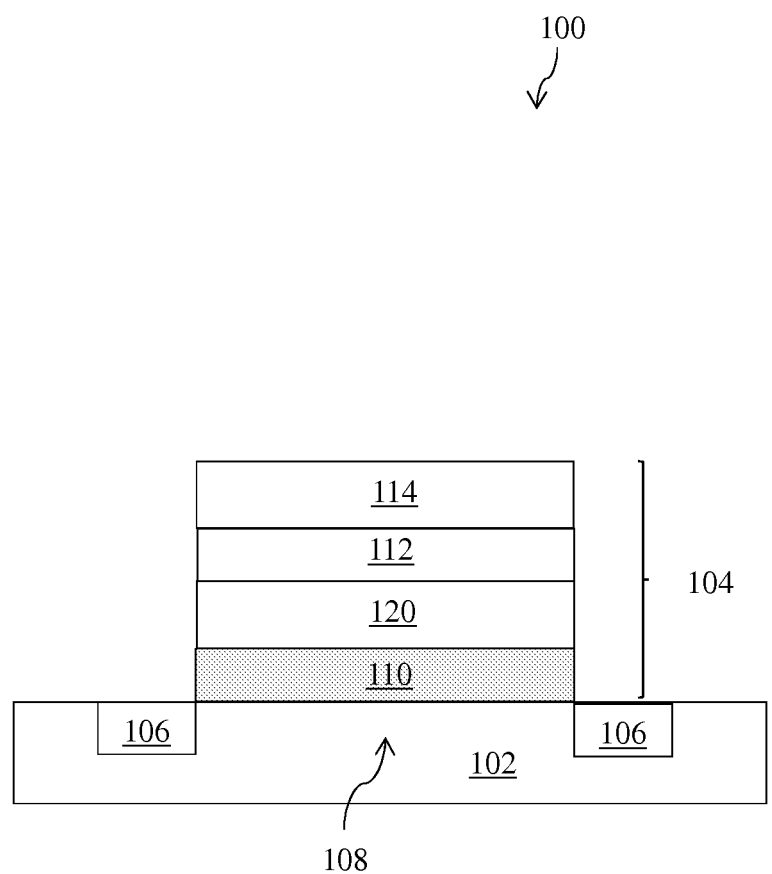
FIGS. 3 through 11 illustrate sectional views of a semiconductor structure, constructed in accordance with various embodiments.

FIG. 3 illustrates a schematic cross-sectional view of a semiconductor structure 100 in accordance with some embodiments. The semiconductor structure 100 in FIG. 3 is similar to the semiconductor structure 100 in FIG. 1. However, in FIG. 3, the gate stack 104 further includes a second dielectric material layer 120 interposed between the first dielectric material layer 110 and the ferroelectric layer 112. In furtherance of the embodiments, the second dielectric material layer 120 is electrically charged to form the charge layer. The second dielectric material layer 120 may function as a diffusion barrier layer to eliminate the diffusion and reaction between the ferroelectric layer 112 and the first dielectric material layer 110, as the first dielectric material layer 110 functions as the gate dielectric layer and the device performance could be degraded by such diffusion and reaction. The second dielectric material layer 120 may include a proper dielectric material. For examples, the second dielectric material layer 120 may include silicon oxide, silicon nitride, silicon oxynitride, silicon carbide, high-k dielectric material or a combination thereof. The second dielectric material layer 122 may be different from the first dielectric material layer 110 in term of composition tuned for respective functions and optimized device performance. The second dielectric material layer 120 may be formed by CVD, ALD, spin-on coating or other suitable technique.

Figure 4:
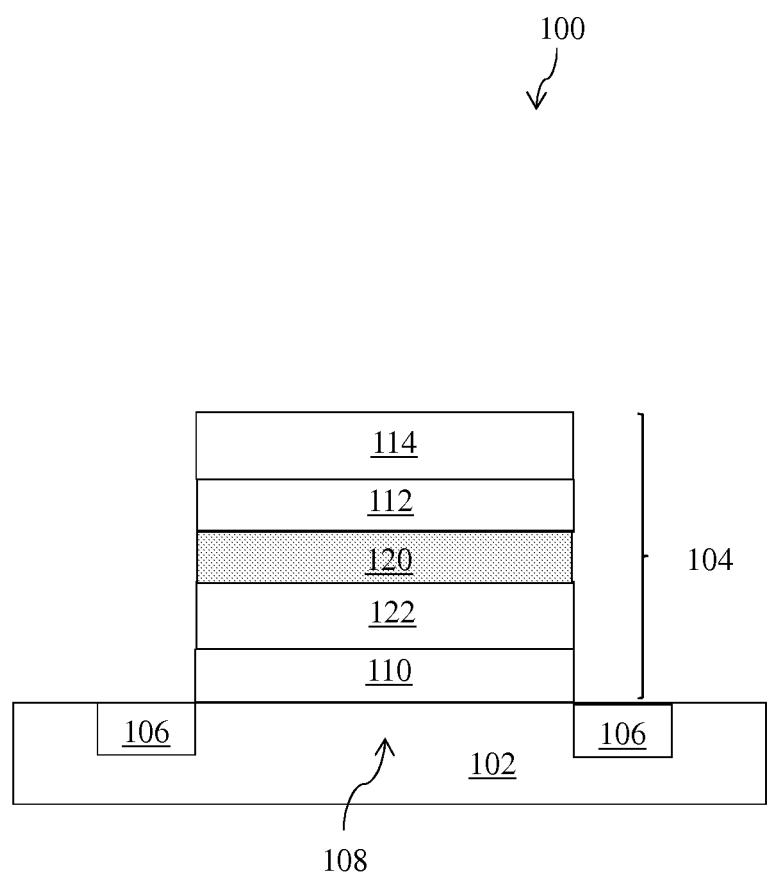

FIG. 4 illustrates a schematic cross-sectional view of a semiconductor structure 100 in accordance with some embodiments. The semiconductor structure 100 in FIG. 4 is similar to the semiconductor structure 100 in FIG. 3. For example, the second dielectric material layer 120 is electrically charged to form the charge layer. However, in FIG. 4, the gate stack 104 further includes a second conductive layer 122 interposed between the first dielectric material layer 110 and the second dielectric material layer 120. The second conductive layer 122 may be similar to the first conductive layer 114 in terms of composition and formation. For example, the second conductive layer 122 includes a metallic material such as silver, aluminum, copper, tungsten, nickel, alloys thereof or silicide, and may be formed using PVD, plating, a combination thereof, or other suitable technology. The second dielectric material layer 120 may function as a diffusion barrier layer to eliminate the diffusion and reaction between the second conductive layer 122 and the ferroelectric layer 112, for better device performance.

Figure 5:
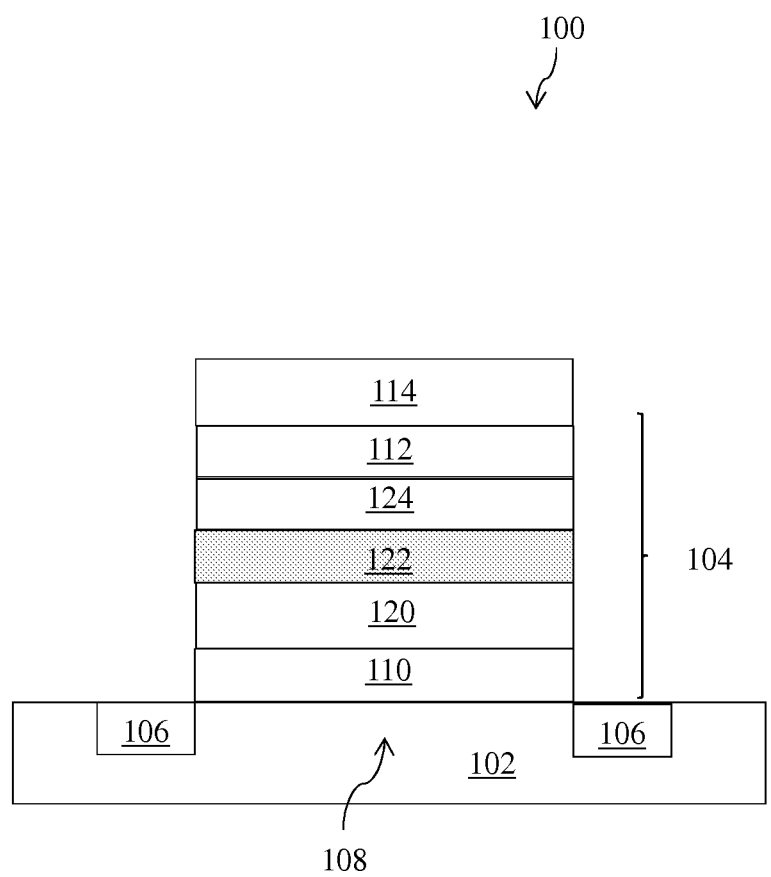

FIG. 5 illustrates a schematic cross-sectional view of a semiconductor structure 100 in accordance with some embodiments. The semiconductor structure 100 in FIG. 5 is similar to the semiconductor structure 100 in FIG. 4. For example, the second dielectric material layer 120 is electrically charged to form the charge layer. However, in FIG. 5, the gate stack 104 further includes a third dielectric material layer 124 interposed between the second dielectric material layer 120 and the ferroelectric layer 112. In some embodiments, the third dielectric material layer 124 may be different from the second dielectric material in composition while the second dielectric material layer 120 may be similar to the first dielectric material layer 110 in terms of composition and formation. The third dielectric material layer 124 may function as a diffusion barrier layer to eliminate the diffusion between the second dielectric material layer 120 and the ferroelectric layer 112. In various examples, the third dielectric material layer 124 may include silicon oxide, silicon nitride, silicon oxynitride, high-k dielectric material or a combination thereof.

Figure 6:
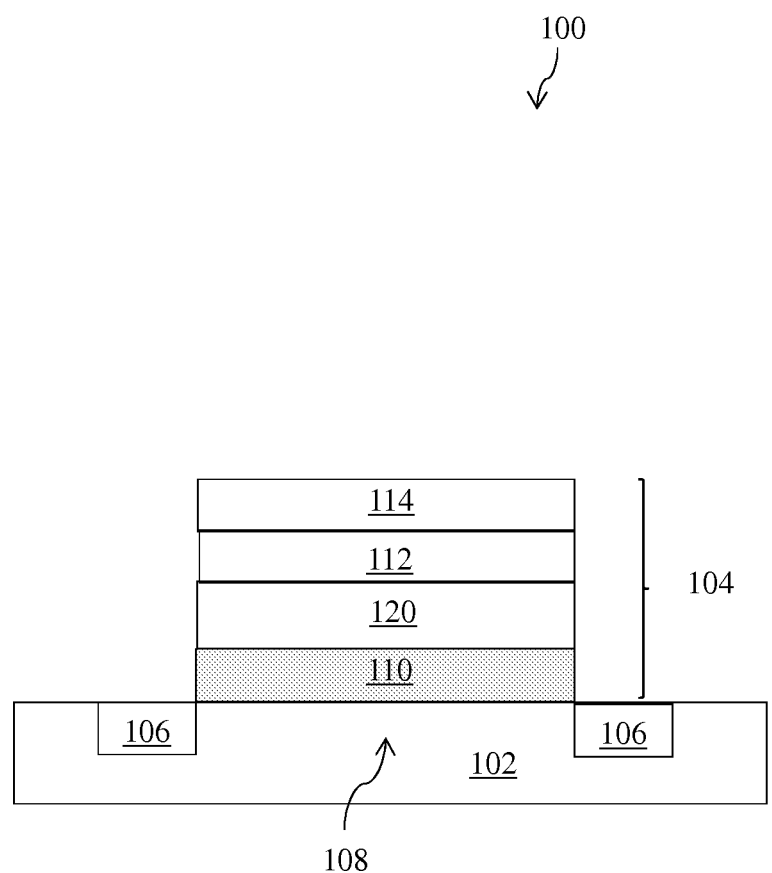

FIG. 6 illustrates a schematic cross-sectional view of a semiconductor structure 100 in accordance with some embodiments. The semiconductor structure 100 in FIG. 6 is similar to the semiconductor structure 100 in FIG. 3. However, in FIG. 6, the first dielectric material layer 110 is electrically charged to form the charge layer. The second dielectric material layer 120 may function as a diffusion barrier layer to eliminate the diffusion and reaction between the ferroelectric layer 112 and the first dielectric material layer 110, considering that the first dielectric material layer 110 functions as the gate dielectric layer and the device performance could be degraded by such diffusion and reaction.

Figure 7:
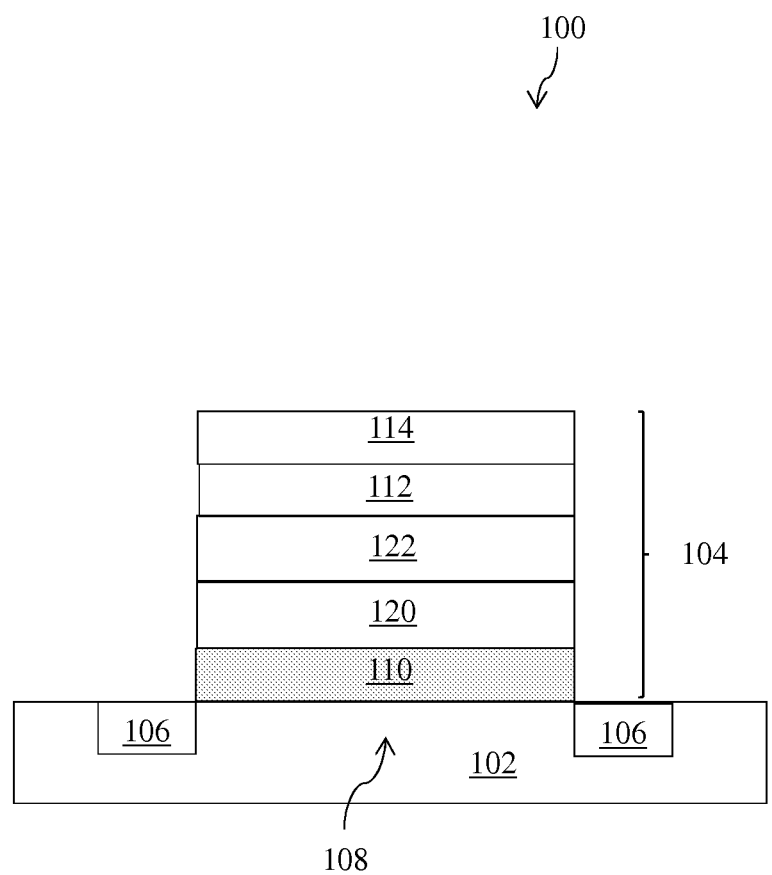

FIG. 7 illustrates a schematic cross-sectional view of a semiconductor structure 100 in accordance with some embodiments. The semiconductor structure 100 in FIG. 7 is similar to the semiconductor structure 100 in FIG. 6. For example, the first dielectric material layer 110 is electrically charged to form the charge layer. However, in FIG. 7, the gate stack 104 further includes a second conductive layer 122 interposed between the second dielectric material layer 120 and the ferroelectric layer 112.

Figure 8:
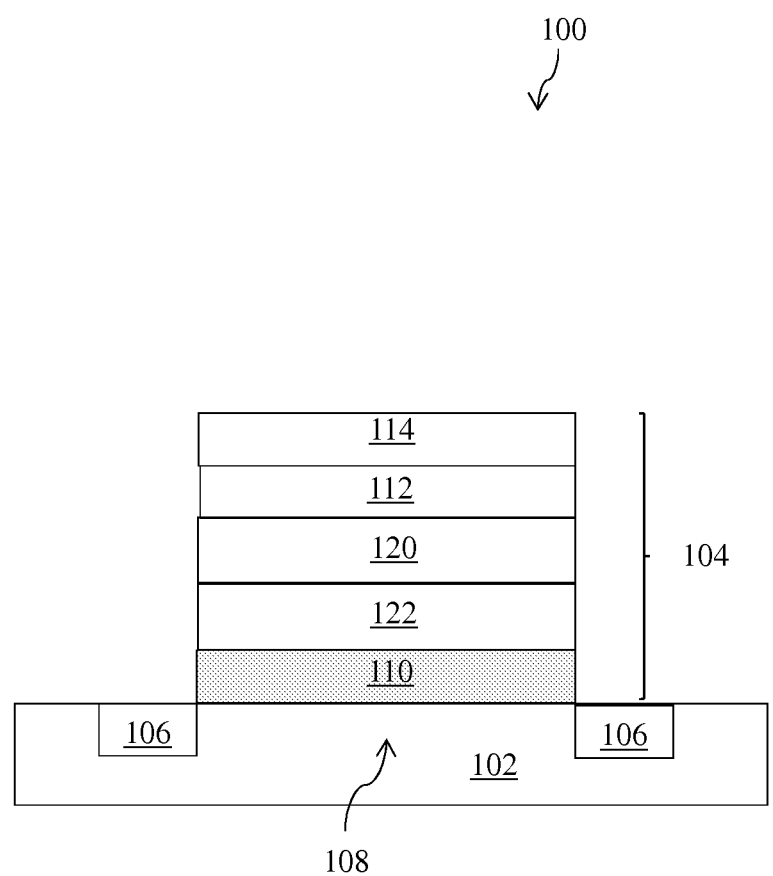

FIG. 8 illustrates a schematic cross-sectional view of a semiconductor structure 100 in accordance with some embodiments. The semiconductor structure 100 in FIG. 8 is similar to the semiconductor structure 100 in FIG. 6. For example, the first dielectric material layer 110 is electrically charged to form the charge layer. However, in FIG. 8, the gate stack 104 further includes a second conductive layer 122 interposed between the first dielectric material layer 110 and the second dielectric material layer 120.

Figure 9:
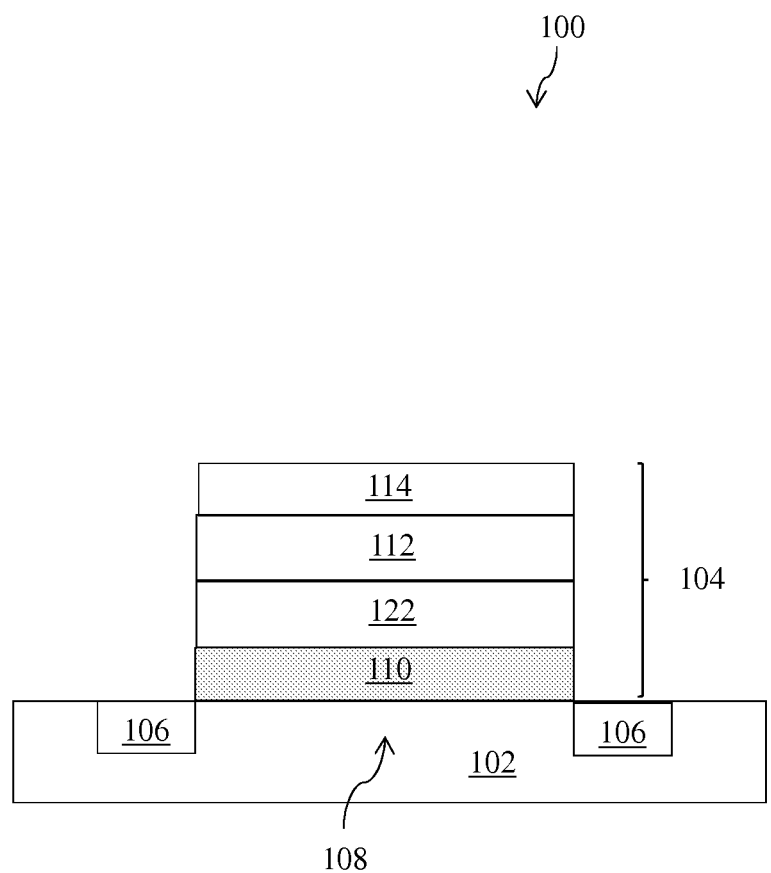

FIG. 9 illustrates a schematic cross-sectional view of a semiconductor structure 100 in accordance with some embodiments. The semiconductor structure 100 in FIG. 9 is similar to the semiconductor structure 100 in FIG. 1. For example, the first dielectric material layer 110 is electrically charged to form the charge layer. However, in FIG. 9, the gate stack 104 further includes a second conductive layer 122 interposed between the first dielectric material layer 110 and the ferroelectric layer 112. The second conductive layer 122 may be similar to the first conductive layer 114 in terms of composition and formation. For example, the second conductive layer 122 includes a metallic material such as silver, aluminum, copper, tungsten, nickel, alloys thereof or silicide, and may be formed using PVD, plating, a combination thereof, or other suitable technology.

Figure 10:
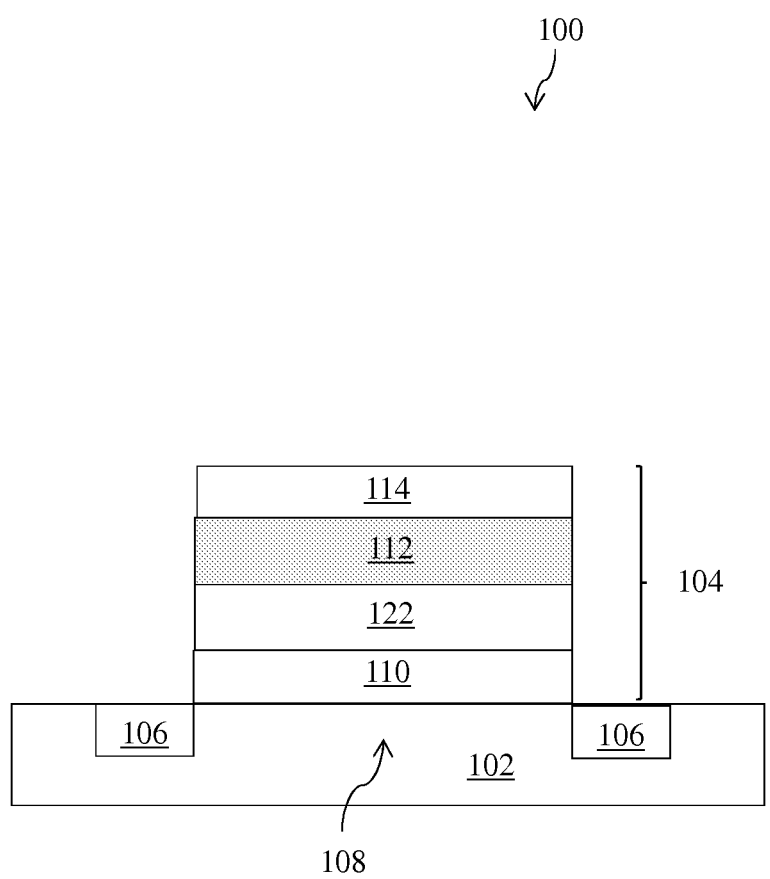

FIG. 10 illustrates a schematic cross-sectional view of a semiconductor structure 100 in accordance with some embodiments. The semiconductor structure 100 in FIG. 10 is similar to the semiconductor structure 100 in FIG. 9. However, in FIG. 10, the ferroelectric layer 112 is electrically charged to form the charge layer.

Figure 11:
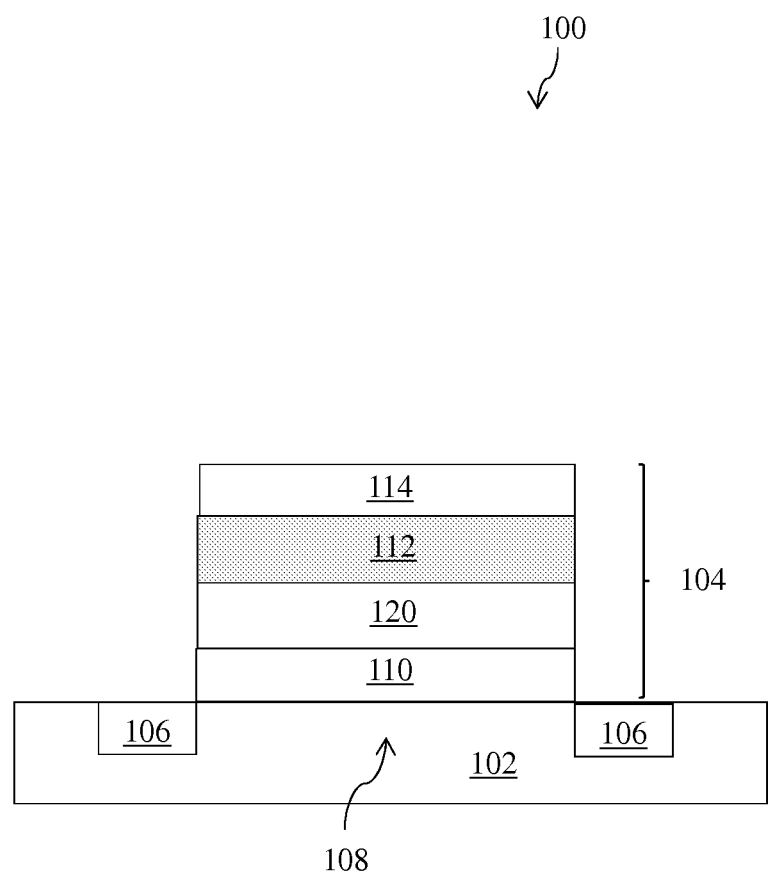

FIG. 11 illustrates a schematic cross-sectional view of a semiconductor structure 100 in accordance with some embodiments. The semiconductor structure 100 in FIG. 11 is similar to the semiconductor structure 100 in FIG. 3. However, in FIG. 11, the ferroelectric layer 112 is electrically charged to form the charge layer.

In the semiconductor structure 100, the negative capacitance FET includes a ferroelectric layer to substantially reduce SS and a charge layer to eliminate the hysteresis. In some examples, the negative capacitance FET with a charge layer (such as a charged gate oxide) in the semiconductor structure 100 has SS reduced to or below 38 mV/dec while the hysteresis is eliminated. The negative capacitance field effect transistors using a gate dielectric layer with fixed charge is able to achieve a non-hysteretic $I_D$-$V_G$ curve and a good subthreshold swing simultaneously.

Figure 12:
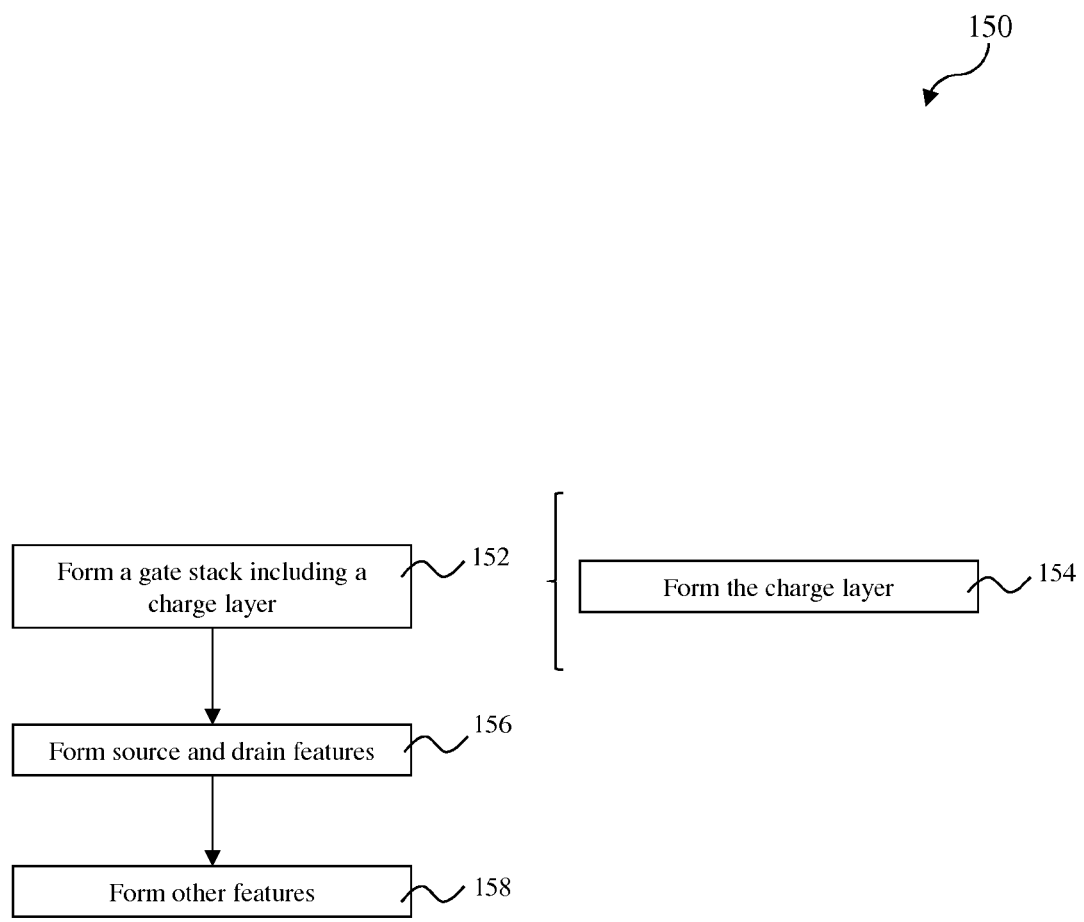
FIG. 12 is a flowchart of a method for making a semiconductor structure, in accordance with some embodiments.

FIG. 12 illustrates a flowchart of a method 150 making the semiconductor structure 100, constructed according to some embodiments. The method 150 includes an operation 152 to form a gate stack 104 on the substrate 102. In the operation 152, the formation of the gate stack 104 includes depositing various gate material layers, such as the first gate dielectric material layer 110, the ferroelectric layer 112 and the first conductive layer 114, or additionally depositing other material layers, such as second dielectric material layer 120 and/or second conductive layer 122.

Especially, the operation 152 includes a process 154 to form a charge layer with fixed charge. One of the first dielectric material layer 110, the ferroelectric layer 112 and the second dielectric material layer 120 is electrically charged to form a charge layer with fixed charge. In some embodiments, the first dielectric material layer 110 functions as gate dielectric and converted to the charged layer by a charging process. The charge layer is formed by a suitable technique, such as an oxygen treatment. In some embodiments, the first dielectric material layer 110 is electrically charged by exposing the first dielectric material layer 110 in an oxygen environment, such as a mixture of CO and $CO_2$ with a partial pressure ranging between $10^{-13}$ and $10^{-19}$ atm, and further at an elevated treatment temperature greater than 900° C. The exposure duration may last up to a few hours, depending on the desired charge density. The charge density of the charge layer can be tuned by tuning various factors of the charging process, such as treatment temperature, partial pressure, treatment duration or a combination thereof. The desired charge density in the charge layer is determined according to the performance of the semiconductor structure 100, such as the hysteresis and the subthreshold swing. In the present embodiments, the charge layer the charged layer has a charge density of $5 \times 10^{13}$ $cm^{-2}$ within 10% variation.

After the depositions and charging to form a charge layer, the gate material layers are patterned to form gate stack 104. The patterning further includes lithography process and etching. A hard mask layer may be used to pattern the gate stack 104.

The method 150 also includes an operation 156 to form source and drain features 106, such that the source and drain features 106 are aligned on the edges of the gate stack 104. In the operation 154, the source and drain 106 may be formed by one or more ion implantation. In some embodiments, for straining effect or other performance enhancement, the source and drain may be formed by epitaxy growth of different semiconductor materials. For example, the substrate 102 within the source and drain region is recessed by etching, and a semiconductor material is epitaxially grown on the recessed region with in-situ doping to form the source and drain features 106.

The method 150 may also include other operations 158 to form various features and components, such as other features for a negative capacitance FET. For examples, an interconnect structure is formed on the substrate 102 and configured to couple various devices into a functional circuit. The interconnection structure includes metal lines distributed in multiple metal layers; contacts to connect the metal lines to devices (such as sources, drains and gates); and vias to vertically connect metal lines in the adjacent metal layers. The formation of the interconnect structure includes damascene process or other suitable procedure. The metal components (metal lines, contacts and vias) may include copper, aluminum, tungsten, metal alloy, silicide, doped polysilicon, other suitable conductive materials, or a combination thereof.

In alternative embodiments, the method 150 may form the gate stack 104 after the formation of the source and drain features 106, such as in a gate-last procedure. For examples, a dummy gate is formed; the source and drain features 106 are formed on sides of the dummy gate by the operation 154; and thereafter, the gate stack 104 is formed to replace the dummy gate by a gate replacement process. Particularly, the gate stack 104 includes a dielectric material layer 110, a ferroelectric layer 112, and a conductive layer 114. One of the ferroelectric layer 112 and the dielectric material layer 110 is electrically charged to the charge layer with fixed charge.

One example of the gate-replacement process is described below. One or more dielectric material (such as silicon oxide, low-k dielectric material, other suitable dielectric material, or a combination thereof) is formed on the dummy gate and the substrate 102. A polishing process, such as chemical mechanical polishing (CMP), is applied to planarize the top surface, thereby forming an interlayer dielectric layer (ILD). The dummy gate is removed by etching, resulting in a gate trench in the ILD. Then the gate stack 104 is formed in the gate trench by depositions and charging treatment, which are similar to those in the operation 152. However, the patterning in the operation 152 may be skipped. However, another CMP process may be followed to remove excessive the gate materials and planarize the top surface.

Figure 13:
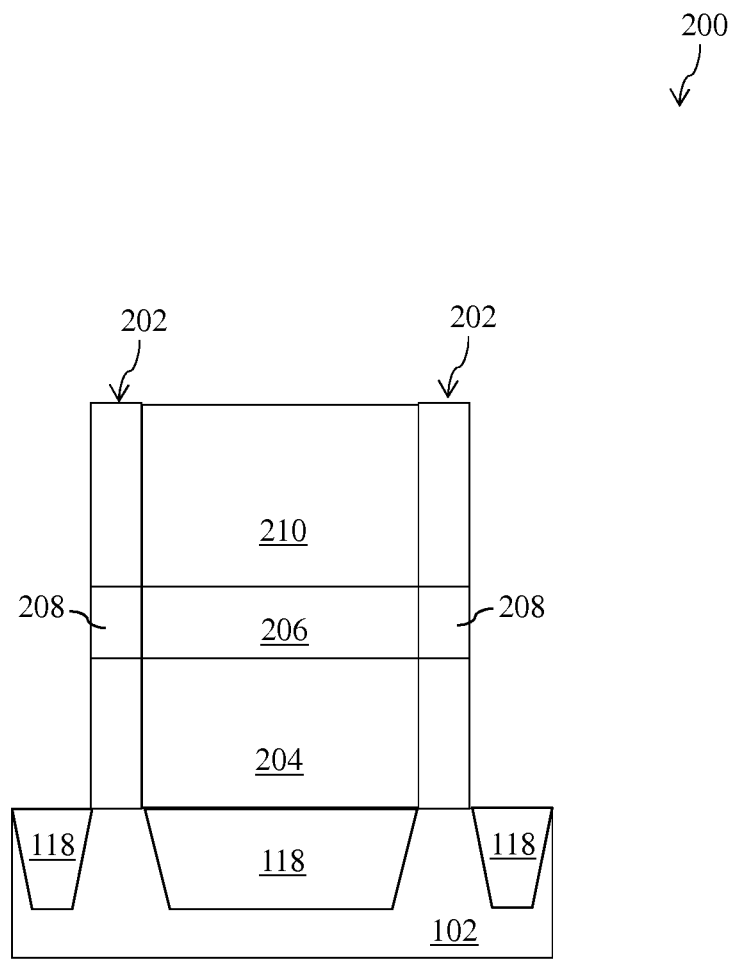
FIG. 13 illustrates a sectional view of a semiconductor structure in accordance with some embodiments.

The negative capacitance FET with a charge layer may have other structures and configurations, such as double gates, multiple gates, or a vertical structure (the channel is vertically configured). FIG. 13 illustrates a schematic cross-sectional view of a semiconductor structure 200 in accordance with some embodiments.

Figure 14:
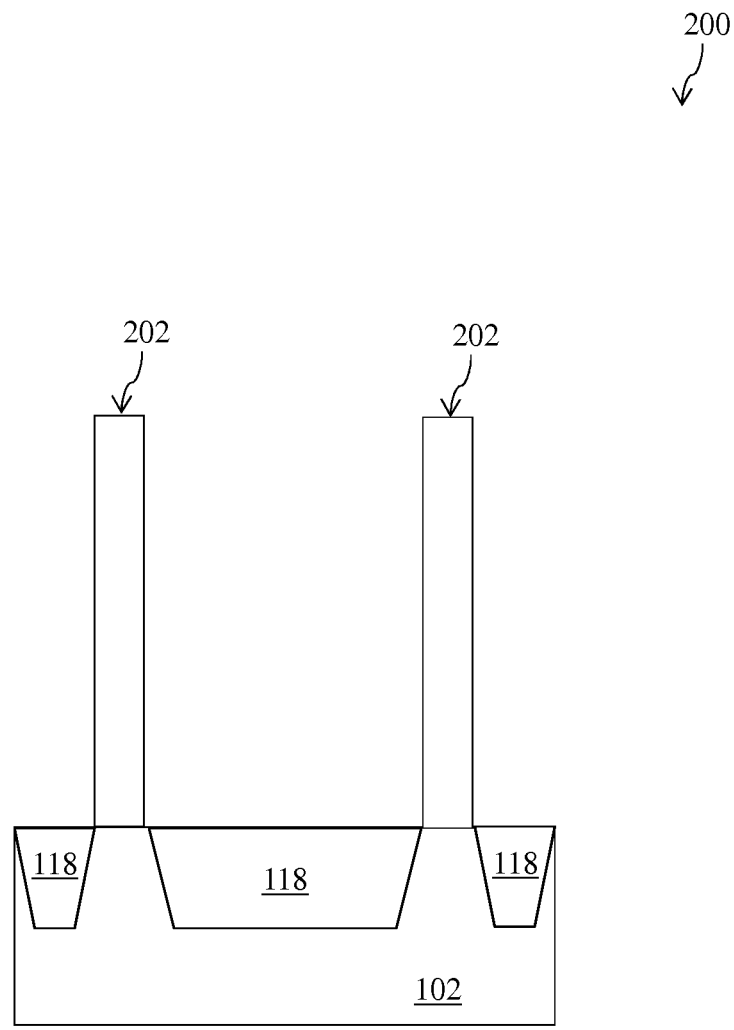
FIGS. 14 through 16 illustrate sectional views of the semiconductor structure of FIG. 13 at various fabrication stages, constructed in accordance with some embodiments.

In FIG. 13, the semiconductor structure 200 includes a substrate 102 and semiconductor features 202, such as vertical semiconductor features like fin-active regions formed by a fin procedure to form fin structures. In some examples as illustrated in FIG. 14, the procedure includes forming STI features 118; and recessing the STI features 118 to form semiconductor features 202. In some other examples still referring to FIG. 13, the procedure includes forming STI features 118; and selectively epitaxial growing to form semiconductor features 202 with a semiconductor material same or different from that of the substrate 102 for device performance, such as straining effect, high carrier high mobility or both. In furtherance of the examples, multiple semiconductor material layers (such as silicon germanium, silicon, III-V group semiconductor and so on) are epitaxially grown on the substrate 102 and may additionally with in-situ doping.

Referring back to FIG. 13, the substrate 102 may further include other isolation features, such as STI features. When the semiconductor features 202 are formed by a fin procedure, the semiconductor structure 200 includes the STI features 118 in a configuration illustrated in FIG. 13, in accordance with some embodiments.

A first gate stack 204 is formed on the substrate 102 within the gap region between the semiconductor features 202. The first gate stack 204 is similar to the gate stack 104 in FIG. 1 in terms of configuration and composition. Particularly, the first gate stack 204 includes the first dielectric material layer 110, the ferroelectric layer 112 and the first conductive layer 114. One of the first dielectric material layer 110 and the ferroelectric layer 112 is electrically charged to form the charge layer with fixed charge. The first gate stack 204 may include other material layers, such as the second dielectric material layer 120 and/or the second conductive layer 122 in various configurations illustrated in FIGS. 3 through 11.

The semiconductor structure 200 also includes a channel region 206 formed on the top of the first gate stack 204; and the source and drain features 208 formed on edges of the channel region 206. In some embodiments, the channel region 206 may be formed by epitaxy growth after the formation of the first gate stack 204 with a semiconductor material. The semiconductor material may epitaxy grow laterally from the semiconductor features 202 and may additionally include in-situ doping during the epitaxy growth using a precursor having semiconductor material-containing chemical and dopant-containing chemical. The source and drain features 208 may be formed by in-situ doping during the procedure to form the semiconductor features 202 or alternatively by ion implantation afterward.

Figure 15:
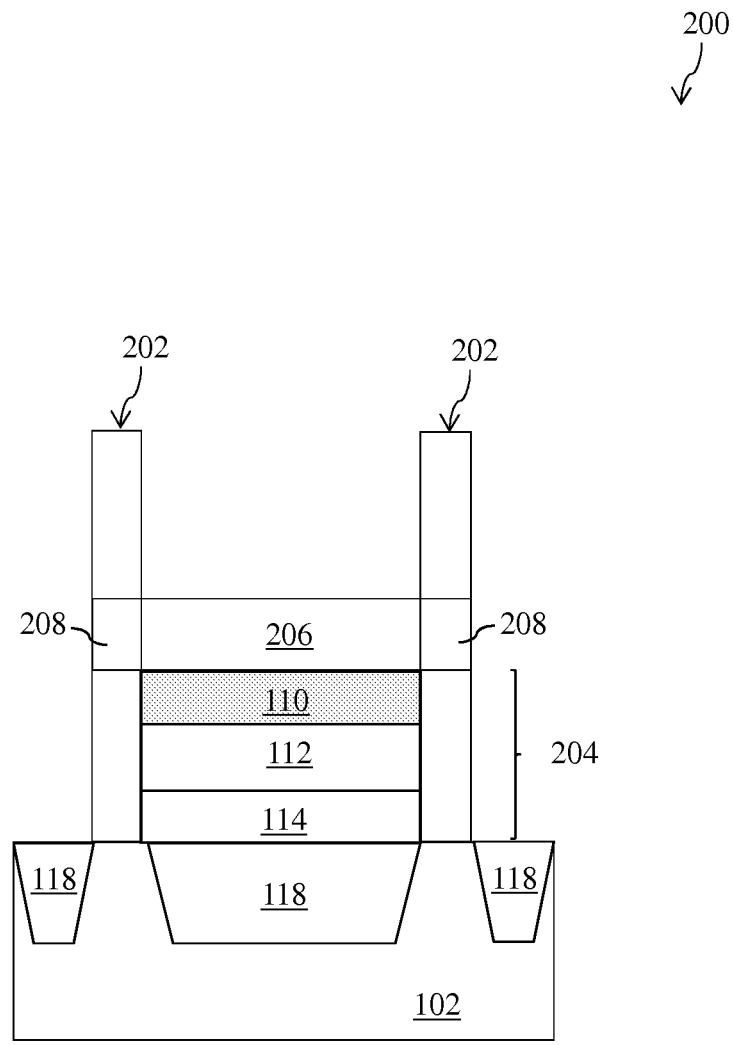

Back to the first gate stack 204. Since the channel region 206 is on top of the first gate stack 204, the first gate stack 204 is similar to the first gate stack in configuration but various material layers in the first gate stack 204 are similarly configured relative to the channel region 206 instead of the substrate 102. For example illustrated in FIG. 15, the first conductive layer 114 is disposed on the substrate 102; the ferroelectric layer 112 is disposed on the first conductive layer 114; and the first dielectric material layer 110 is disposed on the ferroelectric layer 112. The first dielectric material layer 110 is electrically charged to form the charge layer. The first gate stack 204 is similar to the gate stack 104 in configuration but is flipped relative to the channel region 206. In other embodiments, the first gate stack 204 is similar to the first gate stack 104 in one of FIGS. 3-11 but is relative to the channel region 206.

Figure 16:
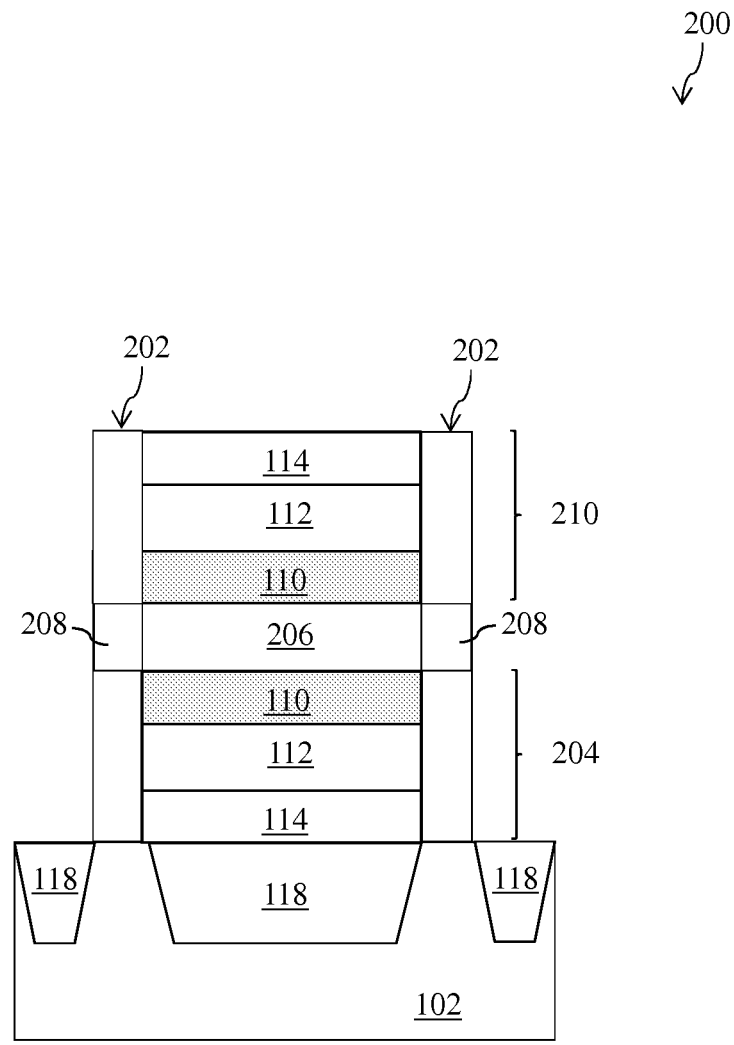

Back to FIG. 13, the semiconductor structure 200 includes a second gate stack 210 formed on the channel region 206 within the gap between the semiconductor features 202. The second gate stack 210 is similar to the first gate stack 204 in terms of configuration and composition but is disposed on the other side of the channel region 206. In the present embodiments, the first gate stack 204 and the second gate stack 210 are symmetrically disposed on the two sides of the channel region 206. In other words, the second gate stack 210 is identical to the first gate stack 204 but is flipped on the other side of the channel region 206. The second gate stack 210 is an image of the first gate stack 204 relative to the channel region 206. For one example illustrated in FIG. 16, the second gate stack 210 includes the first dielectric layer 110 is disposed on the channel region 206; the ferroelectric layer 112 is disposed on the first dielectric material layer 110; and the first conductive layer 114 is disposed on the ferroelectric layer 112. The first dielectric material layer 110 is electrically charged to form the charge layer.

The semiconductor structure 200 has double gates having charge layers and ferroelectric layers in various embodiments. The semiconductor structure 200 may have other alternative and configurations. For example, the first and second gate stacks are asymmetric and only one of the gate stacks has a charge layer.

Figure 17:
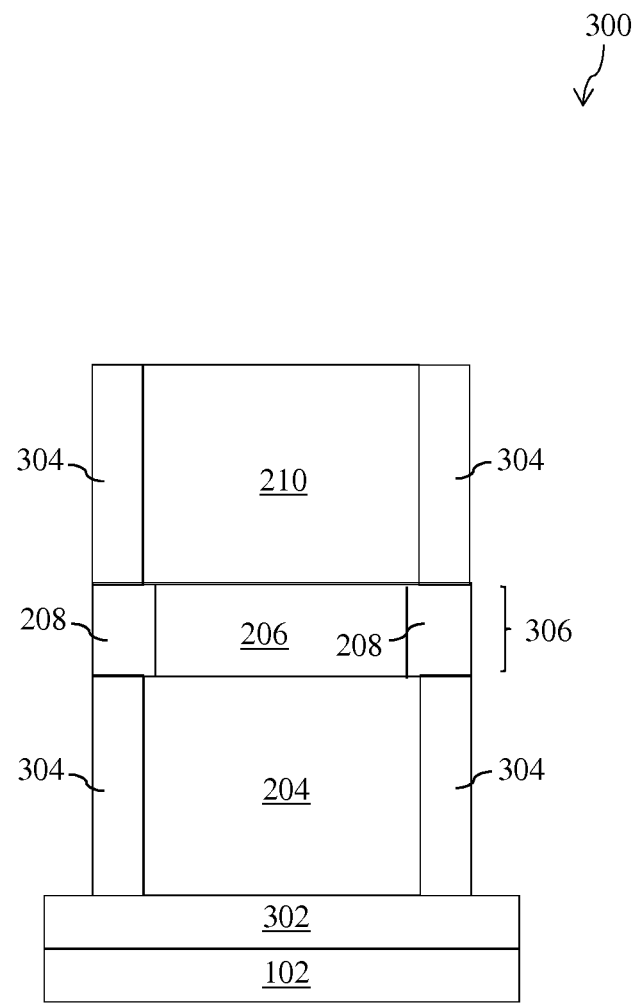
FIG. 17 illustrates a sectional view of a semiconductor structure in accordance with some other embodiments.

FIG. 17 illustrates a schematic cross-sectional view of a semiconductor structure 300 in accordance with some embodiments. In the semiconductor structure 300, the semiconductor features 202 may be replaced by gate spacers; and the source and drain are formed on the first gate stack. Particularly, the semiconductor structure 300 includes a first gate stack 204 formed over the substrate 102. A dielectric material layer 302 may be interposed between the first gate stack 204 and the substrate 102 for performance enhancement, such as for isolation. Gate spacers are formed on the sidewalls of the first gate stack 204. The first gate stack 204 is similar to the first gate stack 204 in FIG. 13 in terms of gate layer composition and gate layer configuration. The formation of the first gate stack 204 includes deposition and patterning, further includes charging one of a dielectric layer and the ferroelectric layer to form the charge layer. The gate spacers 304 are formed by deposition of dielectric material and anisotropic etching.

Then a semiconductor material layer 306 is formed on the first gate stack 206 by a suitable technique, such as deposition by CVD. In this case, the semiconductor material layer 304 may be in polycrystalline or amorphous structure (such as polysilicon or amorphous silicon). Then it is further doped to form the channel region 206; and the source and drain features 208 by a suitable technique, such as one or ion implantation. The semiconductor material layer 306 may include silicon, a semiconductor alloy such as silicon germanium or silicon carbide, a semiconductor compound such as III-V semiconductor material (gallium arsenic or indium arsenic).

Then a second gate stack 210 is formed on the semiconductor material layer 306. The formation of the second gate stack 210 may include deposition, charging treatment and patterning. Additional spacers 304 are formed on sidewalls of the second gate stack 210 by a similar technique, such as deposition and anisotropic etching.

The present disclosure provides a negative capacitance FET and a method making the same. Particularly, the negative capacitance FET includes a ferroelectric layer, and the gate dielectric layer (or the ferroelectric layer) is electrically charged to form a charge layer with fixed charge by a charging treatment. Thus formed negative capacitance FET has reduced subthreshold swing and is also hysteresis-free.

Other embodiments and modifications may be implemented without departing from the spirit of the present disclosure. In some embodiments, the semiconductor structure 300 in FIG. 17 may be formed by other technologies, such as by 3D packaging. Particularly, the second gate stack 210 and the source/drain features are formed on a second substrate similar to the formation of the semiconductor structure 100 in term of configuration, composition and formation. For example, a gate stack is formed on a second substrate by deposition, charging treatment and patterning. The source and drain features are formed on the second substrate by ion implantation or other technique (such as recessing, epitaxy growth and in-situ doping). Thereafter, the second substrate is thinned down from backside to form the semiconductor layer 306. The first gate stack 204 is formed on the first substrate. The first and second substrates are bonding together by 3D packaging to form the semiconductor structure 300 having a charged negative-capacitance FET with double gates.

Thus, the present disclosure provides a semiconductor device in accordance with some embodiments. The semiconductor device includes a substrate; a gate stack over the substrate. The gate stack includes a ferroelectric layer; a first dielectric material layer; and a first conductive layer. One of the first dielectric material layer and the ferroelectric layer is electrically charged to form a charged layer with fixed charge. The semiconductor device further includes source and drain features formed on the substrate and disposed on sides of the gate stack.

The present disclosure provides a semiconductor device in accordance with some embodiments. The semiconductor device includes a first gate stack over a substrate; a channel region is disposed on the first gate stack; a second gate stack is disposed on the channel region; and a source and a drain laterally configured on two sides of the channel regions. Each of the first and second gate stacks includes a ferroelectric layer; a first dielectric material layer; and a first conductive layer, wherein one of the first dielectric material layer and the ferroelectric layer is electrically charged as a charged layer.

The present disclosure provides a method for fabricating a semiconductor device in accordance with some embodiments. The method includes forming a gate stack over a substrate. The forming of the gate stack includes forming a ferroelectric layer; forming a first dielectric material layer; and forming a conductive layer. The method further includes electrically charging one of the first dielectric material layer and the ferroelectric layer, thereby forming a charged layer; and forming source and drain features on sides of the gate stack.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
a substrate;
a gate stack over the substrate, wherein the gate stack includes:
a ferroelectric layer;
a first dielectric material layer; and
a first conductive layer; and
source and drain features formed on the substrate and disposed on sides of the gate stack, wherein one of the first dielectric material layer and the ferroelectric layer is electrically charged to form a charged layer with a fixed charge such that the semiconductor device is hysteresis-free.

2. The semiconductor device of claim 1, wherein
the first dielectric material layer is the charged layer and disposed on the substrate;
the ferroelectric layer is disposed on the charged layer; and
the first conductive layer is disposed on the ferroelectric layer.

3. The semiconductor device of claim 2, further comprising a second dielectric material layer interposed between the ferroelectric layer and the first dielectric material layer.

4. The semiconductor device of claim 3, further comprising a second conductive layer disposed between the second dielectric material layer and the ferroelectric layer.

5. The semiconductor device of claim 3, further comprising a second conductive layer disposed between the first dielectric material layer and the second dielectric material layer.

6. The semiconductor device of claim 2, further comprising a second conductive layer interposed between the ferroelectric layer and the first dielectric material layer.

7. The semiconductor device of claim 6, wherein the first dielectric material layer is not the charged layer and the ferroelectric layer is the charged layer with fixed charge.

8. The semiconductor device of claim 3, wherein the ferroelectric layer is the charged layer with fixed charge and the first dielectric layer is not the charged layer.

9. The semiconductor device of claim 1, wherein
the ferroelectric layer includes a ferroelectric material selected from the group consisting of HfSiOx, HfZrOx, Al2O3, TiO2, LaOx, BaSrTiOx (BST), PbZrxTiyOz (PZT), and a combination thereof.

10. The semiconductor device of claim 1, wherein the charged layer has a charge density of $5\times10^{13}$ cm$^{-2}$ within 10% variation.

11. The semiconductor structure of claim 1, further comprising a second gate stack interposed between the substrate and a channel region and a shallow trench isolation (STI) feature disposed below the second gate stack, wherein the channel region is interposed between the gate stack and the second gate stack vertically and disposed between the source and the drain in horizontally.

12. The device of claim 1, wherein the ferroelectric layer has a thickness between 0.1 μm to 1 μm.

13. The device of claim 1, wherein the conductive layer includes a metallic material selected from the group consisting of silver, aluminum, copper, tungsten, nickel, alloys, and metal compound.

14. A semiconductor device comprising:
a shallow trench isolation (STI) feature in a substrate
a first gate stack directly on the STI feature;
a channel region disposed on the first gate stack;
a second gate stack disposed on the channel region; and
a source and a drain laterally configured on two sides of the channel region and connected to the channel region, wherein each of the first and second gate stacks includes:
a ferroelectric layer;
a first dielectric material layer; and
a first conductive layer, wherein one of the first dielectric material layer and the ferroelectric layer is electrically charged as a charged layer with fixed charge.

15. The semiconductor device of claim 12, further comprising a first semiconductor feature and a second semiconductor feature formed on the substrate and contacting the sides of the first and second gate stacks, wherein the first and second semiconductor features are vertically extended from the substrate to a semiconductor top surface being coplanar with a top surface of the second gate stack; and the source and drain are portions of the first and second semiconductor features, respectively.

16. The semiconductor device of claim 15, wherein the first and second semiconductor features include germanium and the dielectric material layer includes germanium oxide.

17. The semiconductor device of claim 14, wherein
the first and the second gate stacks are symmetrically configured on bottom surface and top surface of the channel region, respectively;
the STI feature, the first gate stack, the channel region and the second gate stack laterally span a same dimension;
the two sides of the channel region are aligned with corresponding sides of the STI feature, the first gate stack, and the second gate stack; and
the source and drain disposed directly on an active region, continuously extended from the active region, and having sides aligned with the sides of the STI feature, the first gate stack, the channel region and the second gate stack.

18. A semiconductor device comprising:
a gate stack over a substrate, wherein the gate stack includes:
  a first dielectric material layer formed over the substrate;
  a second dielectric material layer formed over the first dielectric material layer;
  a second conductive layer disposed between the first dielectric material layer and the second dielectric material layer;
  a ferroelectric layer formed over the second dielectric layer; and
  a first conductive layer formed over the ferroelectric layer; and
source and drain features formed on the substrate and disposed on sides of the gate stack, wherein the first dielectric material layer is electrically charged to form a charged layer with a fixed charge and a charge density of $5 \times 10^{13}$ cm$^{-2}$ within 10% variation.

19. The device of claim 18, wherein
the ferroelectric layer has a thickness ranging from 0.1 μm to 1 μm; and
the ferroelectric layer includes a ferroelectric material selected from the group consisting of HfSiOx, HfZrOx, Al2O3, TiO2, LaOx, BaSrTiOx (BST), PbZrxTiyOz (PZT), and a combination thereof.

20. The device of claim 18, wherein the fixed charge is present in the charged layer regardless whether the semiconductor device is biased.

* * * * *